(12) United States Patent
Karkkainen

(10) Patent No.: US 7,663,210 B2
(45) Date of Patent: Feb. 16, 2010

(54) OPTICAL COMPONENT ASSEMBLY

(75) Inventor: Ari Karkkainen, Oulu (FI)

(73) Assignee: Optitune plc, London (GB)

( * ) Notice: Subject to any disclaimer, the term of this patent is extended or adjusted under 35 U.S.C. 154(b) by 0 days.

(21) Appl. No.: 10/698,948

(22) Filed: Nov. 3, 2003

(65) Prior Publication Data

US 2004/0121520 A1    Jun. 24, 2004

(30) Foreign Application Priority Data

Nov. 1, 2002    (GB) .................................. 0225522.2

(51) Int. Cl.
*H01L 23/495* (2006.01)
(52) U.S. Cl. .................... 257/671; 257/226; 257/228; 257/E21.511; 385/14; 385/49; 385/51; 438/25
(58) Field of Classification Search ......... 257/226–228, 257/671, E21.511; 438/25, 31; 385/51
See application file for complete search history.

(56) References Cited

U.S. PATENT DOCUMENTS

| | | | | |
|---|---|---|---|---|
| 5,259,049 A * | 11/1993 | Bona et al. | ..................... | 385/49 |
| 5,379,359 A * | 1/1995 | Gupta | ......................... | 385/49 |
| 5,478,778 A | 12/1995 | Tanisawa | | |
| 5,488,678 A * | 1/1996 | Taneya et al. | .................. | 385/14 |
| 5,684,902 A * | 11/1997 | Tada | ............................ | 385/88 |
| 5,972,516 A * | 10/1999 | Kaneko et al. | .............. | 428/429 |
| 6,316,281 B1 | 11/2001 | Lee et al. | ........................ | 438/31 |
| 6,511,236 B1 | 1/2003 | Webjorn et al. | ............... | 385/91 |
| 6,628,854 B1 * | 9/2003 | Koh et al. | ...................... | 385/14 |
| 6,778,718 B2 * | 8/2004 | Maxwell | ....................... | 385/14 |
| 6,816,660 B2 * | 11/2004 | Nashimoto | ................... | 385/131 |
| 6,922,508 B2 * | 7/2005 | Glebov et al. | ................. | 385/43 |
| 6,987,913 B2 * | 1/2006 | Blauvelt et al. | ............... | 385/50 |
| 2002/0031306 A1 * | 3/2002 | Ambrosy et al. | ............. | 385/49 |
| 2004/0037531 A1 * | 2/2004 | Andrews et al. | ........... | 385/130 |

FOREIGN PATENT DOCUMENTS

| | | |
|---|---|---|
| EP | 0 642 045 A1 | 3/1995 |
| EP | 0 818 696 A2 | 1/1998 |
| WO | 01/18580 | 3/2001 |

* cited by examiner

*Primary Examiner*—Wael Fahmy
*Assistant Examiner*—John C Ingham
(74) *Attorney, Agent, or Firm*—Nixon & Vanderhye P.C.

(57) ABSTRACT

Optical components are flip chip mounted onto a substrate for improved alignment. Each device is fabricated using "build-up" layers above a substrate. Each has an optical confinement region in which optical radiation travels in use, and a bonding surface. The overall depth of the layers above the optical confinement region is closely controlled during fabrication, for instance by the use a "spacer" layer, so that when the devices are subsequently flip chip mounted adjacent one another on a shared substrate by means of their bonding surfaces, they can be passively positioned so that their optical confinement regions abut and optical radiation can be coupled from one to the next in use.

22 Claims, 5 Drawing Sheets

OPTICAL COMPONENT ASSEMBLY

CROSS REFERENCE TO RELATED APPLICATION

This application claims priority from GB application No. 225,522.2 filed Nov. 1, 2002.

BACKGROUND

1. Technical Field of Exemplary Embodiments of the Present Invention

The present invention relates to mounted optical components and finds particular application where two or more optical components are mounted for optical alignment.

2. Description of Related Art

Flip chip mounting is known for use in mounting semiconductor devices. It is also known for use in mounting optical devices. Reference can be made for example to U.S. Pat. Nos. 5,478,778 and 6,316,281 and to European patent application number 0642045. The technique comprises fabricating a planar device and then inverting it onto a bonding area on a substrate. Bonding material applied to the bonding area can also be used to make an electrical connection to the device and this has advantages in some circumstances over the older technique of wire bonding. For example, for high speed devices it has been found that wire bonds can act as an unwanted aerial.

SUMMARY OF EXEMPLARY EMBODIMENTS OF THE PRESENT INVENTION

According to a first aspect of the present invention, there is provided an optical assembly comprising:

i) at least first and second optical components, each having an optical confinement region and an optical axis in use, and at least the first optical component having a bonding surface; and ii) a shared substrate, wherein the first component is mounted on the shared substrate by means of its bonding surface and the first and second components are supported by the shared substrate such that their respective optical confinement regions are optically coupled in use, and wherein at least the first component comprises a spacing layer which determines the distance from the bonding surface to the optical axis of the first component to achieve said optical coupling in use.

Such an assembly can be constructed using flip chip mounting for one or both of the first and second components to achieve optical alignment in a relatively simple manner. Because the distances from the bonding surfaces to the optical axes of the first and second components can be matched by use of the spacing layer, flip chip mounting produces passive alignment in the direction normal to the bonding surfaces. Alignment in the other two directions, in a plane parallel to the bonding surfaces, can be achieved using known alignment marking techniques.

Embodiments of the present invention differ from known assemblies using flip chip mounting because in known assemblies, optical alignment of a flip chip mounted component is achieved through adjusting the design of the substrate on which it is to be mounted. In embodiments of the present invention, it is primarily the dimensions of the component to be flip chip mounted which are adjusted by the use of the spacing layer. This means that more than one optical component can be flip chip mounted onto a planar shared substrate, in optical alignment with each other, as long as their dimensions have been matched to produce the optical alignment.

Optionally, additional positioning features can be provided on or by the shared substrate.

It should be noted that, in this context, "matched" does not necessarily mean identical. It merely means that the distances between the bonding surfaces to the axes of the optical confinement regions of the component are such that optical alignment is achieved after the component are in place on the shared substrate.

In general, optical alignment of the first and second components on the substrate can be achieved using more than one different technique. For example, the distances from the bonding surfaces to the optical axes of the first and second components can be matched by fabricating both components to give accurately controlled distances. Alternatively, they can be matched by adjusting the distance for one of the components, using a spacing layer, so as to match the distance for the other component.

The last mentioned technique has the advantage that it could be used where the first and second components have been fabricated, or even sourced, separately. It is possible to add a "spacing" layer of material to the first or second component in order to match the distance between its optical axis and its bonding surface to that of the other component so that subsequent flip chip mounting will produce the required passive optical alignment.

In practice, it is not always necessary in an embodiment of the present invention that the distance between the optical axis and the bonding surface in a first component is exactly matched to that distance in a second component. Firstly, the accuracy required for optical alignment will vary. For example, if optical loss is a very significant factor, or if a component has a very small beam spot size, it is likely that a high degree of accuracy in optical alignment between the components will be necessary. If losses are not important, for example because the local optical power budget is high, or beam spot size in the components is high, then the accuracy required may be lower. Using planar fabrication techniques for the first and second components, it should be possible to achieve an accuracy in the distance between a bonding surface and an optical axis which is in the range 300 nm or less, or even 100 nm or less. Secondly, in order to get optical alignment it may be necessary to take the mounting technique into account. For example, the use of bonding material introduces the thickness of the layer of bonding material itself which has to be taken into account. If different bonding techniques or materials are used for the first and second components, then the thicknesses of the layers of bonding material may be different.

Planar fabrication techniques which might be used include chemical vapour and physical evaporation deposition techniques. These are both capable of high degrees of accuracy in control of layer depths. However, they have disadvantages. They tend to be expensive techniques to use and if used for thick films, for instance 1 µm or more, then they can take a long time. There is also generally a limit to the thickness of film produced.

An alternative to chemical vapour and physical evaporation deposition techniques is the use of polymer materials. However, these lack thermal and environmental stability while some of the polymeric materials may create high mechanical stresses in a chip or a wafer due to poorly matched coefficients of thermal expansion (CTE).

A class of materials which are particularly suitable for use in embodiments of the present invention is the class of hybrid glass materials, these comprising an amorphous or non-crystalline solid material having both organic and inorganic components.

In the hybrid glass material, an inorganic matrix can be provided at least in part by an appropriate inorganic network former such as any metal alkoxide or salt that can be hydrolysed, including those based on groups 3A, 3B, 4B and 5B of the Periodic Table, such as silicon dioxide, aluminium oxide, titanium dioxide and zirconium oxide. Functional organic components can then be used to modify the inorganic matrix.

These materials can be selected to have particular characteristics to suit a particular application. For instance, a hybrid glass material can be selected that can be processed using either high or low processing temperatures, and simple processing techniques. Hybrid glass materials are generally relatively stable and have mechanical properties which are more adjustable than either an organic material or an inorganic glass on its own. They can be selected to be easy to polish by having a high elastic modulus (>2 GPa), they can be thermally stable up to 500° C. and they can be used in standard integrated circuit processing and manufacturing lines to produce layers of accurate thickness.

Hybrid glasses are disclosed in the following publication: "Siloxane-Based Hybrid Glass Materials for Binary and Grayscale Mask Photoimaging", by A. H. O. Kärkkäinen, J. T. Rantala, A. Maaninen, G. E. Jabbour and M. R. Descour, published in Advanced Materials, Vol. 14, No. 7, pp 535-540 (2002). Gray scale lithography of hybrid glass materials is described for example in the following: "Fabrication of Micro-Optical Structures by Applying Negative-Tone Hybrid Glass Materials and Greyscale Lithography", by A. H. O. Kärkkäinen, J. T. Rantala, M. R. Descour, published in Electronics Letters, Vol. 38, No. 1, pp 23-24 (2002).

The optical axis of a component usually lies in a structure of the component which provides optical confinement in use. In a component fabricated using a planar fabrication technique, this structure is usually provided as a layer of material. For example, in a planar waveguide, this structure would be the core layer, having higher refractive index than the material around it. In a buried heterostructure laser diode, this would be the layer providing the active region in which lasing occurs in use. In practice, optical radiation travelling in a component does not travel entirely within the core layer or active region or equivalent structure but spreads somewhat beyond it. However, in this specification, unless the context indicates otherwise, an optical confinement region is used to mean the structure providing optical confinement and containing the optical axis of the component.

An embodiment of the present invention in its first aspect might comprise an optical assembly as described above, wherein at least one of the first and second optical components includes a spacing layer of material between its bonding surface and its optical confinement region which spacing layer comprises a glass material having both organic and inorganic components.

The spacing layer might provide the whole distance between the bonding surface and the optical confinement region, or only part thereof.

As indicated above, flip chip mounting can be used to mount two or more optical components, each having its own respective substrate, in passive optical alignment on a shared substrate. A flip chip mounting process in which each component has been fabricated on its own substrate and is then inverted onto the shared substrate and mounted via its bonding surface, creates a sandwichlike optical assembly in which the optical components are positioned between the shared substrate and their own respective substrates.

Hence according to a second aspect of the present invention, there is provided an optical assembly comprising at least first and second optical components mounted in optical alignment with each other, each component comprising at least one layer and a substrate and providing an optical confinement region in use, wherein the optical assembly further comprises a shared substrate, the first and second optical components each being mounted so that its optical confinement region lies between its respective substrate and the shared substrate.

In embodiments according to the invention, a substrate comprised by a first component might have different characteristics from a substrate comprised by a second component, and in particular might have a different depth. When first and second components have been inverted onto a shared substrate, their own respective substrates need have no effect on optical alignment which is determined instead by the relationship between each component's bonding surface and an optical confinement region in the component. This might be particularly convenient for example where one of the components comprises an active device such as a laser diode which requires heat sinking. A heat sink can be provided as, or in contact with, the respective substrate of the active device without affecting its optical alignment with another component once mounted on the shared substrate.

In embodiments according to this second aspect of the present invention, at least one of the components is likely to require a spacing layer of material between its bonding surface and its optical confinement region, as described above in relation to the first aspect of the present invention. This is because separately fabricated components are unlikely to have matching distances between the bonding surface and the optical confinement region and the spacing layer will be required to adjust at least one of the components to achieve said matching.

In embodiments of the present invention according to the first and second aspects of the present invention, the shared substrate may be planar, which can simplify fabrication of that substrate. In that case, the use of a spacing layer in at least one of the components could be very important in achieving optical alignment in the finished assembly. However, even where the shared substrate is not planar, for example because it is provided with a recess for receiving a flip chip mounted component, it may still be advantageous to provide a spacing layer in at least one of the components. This means that fabrication of the substrate can have larger tolerances and it also means that devices can be substituted without having to redesign the substrate to achieve optical alignment in the finished assembly.

According to a third aspect of the present invention, there is provided a method of mounting at least two optical components in optical alignment on a shared substrate, the method comprising the steps of:

i) using a planar fabrication technique to determine the distance between an optical axis and a bonding surface in at least one of the optical components so that said distance is matched for optical alignment in use of the at least two optical components; and ii) flip chip mounting said at least one of the optical components to provide said optical alignment on the shared substrate by means of its bonding surface.

In an example of an embodiment of the present invention, a first component might comprise a semiconductor chip such as a laser diode and a second component might comprise a waveguide, particularly a planar waveguide. These can be fabricated separately, indeed they can be sourced separately, and then mounted in optical alignment by flip chip mounting at least one of them to create an optical assembly according to an embodiment of the present invention. In order to achieve the optical alignment after step ii) above, particularly for components which have been sourced separately, it is likely that step i) will be important to adjust the distance between an optical axis and a bonding surface of one of the components since otherwise they are unlikely to be matched for optical alignment after flip chip mounting of one or both.

The combination of a laser diode and a planar waveguide as the first and second components is likely to be a particularly useful one since the waveguide can be used to direct the output of the laser to another component or components, such as an optical fibre or a modulator. Further, the waveguide can act as an external cavity for the laser diode, thus for example narrowing its linewidth.

Packaging, assembly and alignment of optical components and systems can potentially become easier, cheaper and/or more reliable by using an embodiment of the present invention. Embodiments of the present invention are particularly suitable for packaging and integration of optoelectronic components at wafer-level.

An advantage of embodiments of the present invention is an increased flexibility in making electrical connection to optoelectronic components. Not only can wire bonds be used, for instance from a device to contact pads on a substrate, but connection can also or alternatively be made through the mounting by using a conductive material at the mounting interface to the shared substrate, together with contact pads or areas on the shared substrate.

It should be understood that any feature described and/or claimed in relation to one aspect of the invention may be applied in relation to one or more other aspects of the invention if appropriate, and in any combination. For instance, any one or more of the features described and/or claimed in relation to the first and second aspects of the present invention might be applied in an embodiment according to the third aspect of the invention.

BRIEF DESCRIPTION OF THE DRAWINGS

A process for wafer level packaging, and a packaged assembly, will now be described as embodiments of the present invention, by way of example only, with reference to the accompanying figures in which.

It should be noted that none of the figures is intended to be drawn to scale. The figures are schematic representations only.

DESCRIPTION OF AN EXEMPLARY EMBODIMENT OF THE INVENTION

Figure 1:
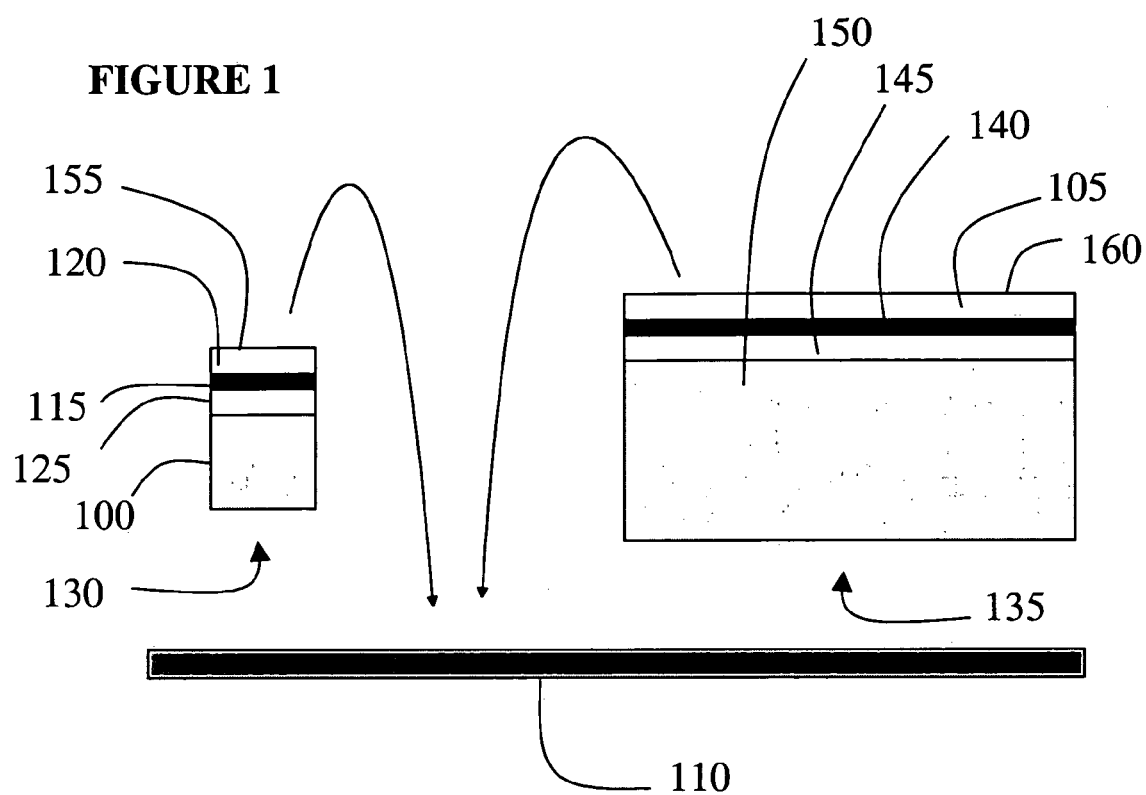
FIG. 1 shows schematically, in side view, a step in assembling a pair of optical components in optical alignment on a shared substrate.
Figure 2:
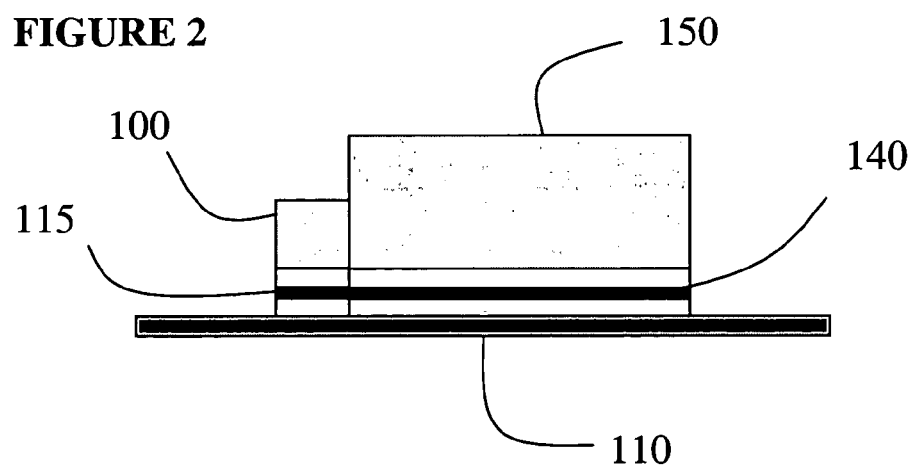
FIG. 2 shows the optical components of FIG. 1 assembled on the substrate.

Referring to FIGS. 1 and 2, a brief overview of an embodiment of the process is as follows.

A laser diode 130 is fabricated on a first substrate 100 and a waveguiding device 135 is fabricated on a second, separate substrate 150. Both devices 130, 135 have optical confinement regions defined by a core layer 115, 140 between upper and lower (as shown) cladding layers 120, 125, 105, 145. Both confinement regions lie at the same depth, determined by their upper cladding layers 120, 105. The exposed surfaces of these respective upper cladding layers 120, 105 provide bonding surfaces 155, 160. The laser diode 130 and the waveguiding device 135 are then flip chip mounted, by means of the bonding surfaces, onto a shared substrate 110. Because both confinement regions lie at the same depth from their respective bonding surfaces 155, 160, the mounted devices 130, 135 are automatically optically aligned in the dimension normal to their bonding surfaces 155, 160.

Known alignment techniques such as alignment markings can be used to achieve optical alignment in the other two dimensions, in a plane parallel to the shared substrate 110.

Importantly, as shown in the figures, the first and second substrates 100, 150 can be of significantly different thicknesses. This has no effect on the optical alignment of the two confinement regions after flip chip mounting. The substrate thicknesses may be different by several tens or hundred of micrometers without reducing alignment accuracy for single mode optical devices and components.

The depth of the layers defining the confinement regions however has to be accurately controlled. The depths of the lower cladding layers 125, 145 and the core layers 115 have to be dimensioned to achieve any necessary optical characteristics of the devices in use, such as beam spot size. However, the upper cladding layers 120, 105 act as "spacing" layers once the devices have been flip chip mounted, controlling the vertical positions of the optical axes of the devices and thus affecting their optical alignment. Thus the depths of these spacing layers are also important. Depth control in each of the layers is relatively easy in embodiments of the present invention, using planar fabrication techniques.

The "spacing" layers might be deposited in any of a variety of known ways such as spin-on, solution dipping or evaporation techniques. It is relatively easy using known planar fabrication techniques to control the depths of deposited layers which are several micrometers thick, for instance more than 15 micrometers thick, to within an error margin of 300 nm, or even 100 nm, or less.

Optical Alignment

In FIGS. 1 and 2, relatively simple core and cladding layers 115, 140, 120, 125, 105, 145 are shown. In practice, the layers may have an even simpler, or a more complex, structure. For example, the upper cladding, or spacing, layers 120, 105 might themselves be multi-layered.

In a waveguiding device 135, there may be fewer layers involved. This might be the case if the substrate 150 exhibits optical quality and its refractive index is lower than the index of the core layer 140. In these circumstances, the lower cladding layer 145 might not be required. Alternatively, in a laser diode 130, the layers may have a complex structure in order to provide current blocking either side of a gain region in order to achieve lasing.

Figure 3:
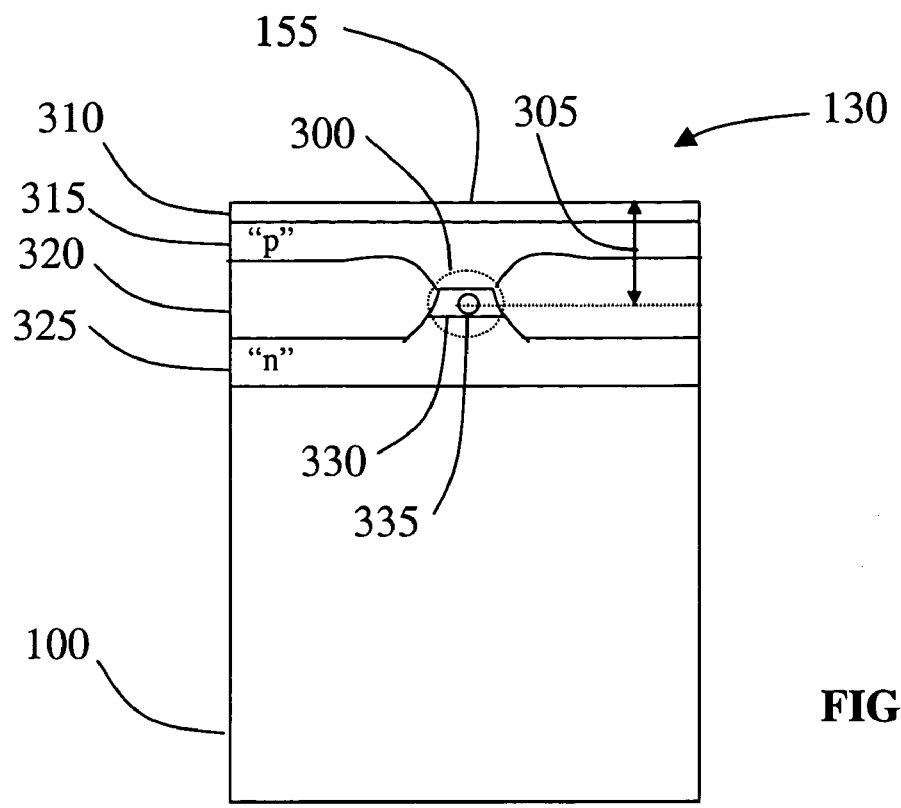
FIG. 3 shows schematically in transverse cross section the structure of a laser diode which might be used as a first of the optical components of FIG. 1.
Figure 4:
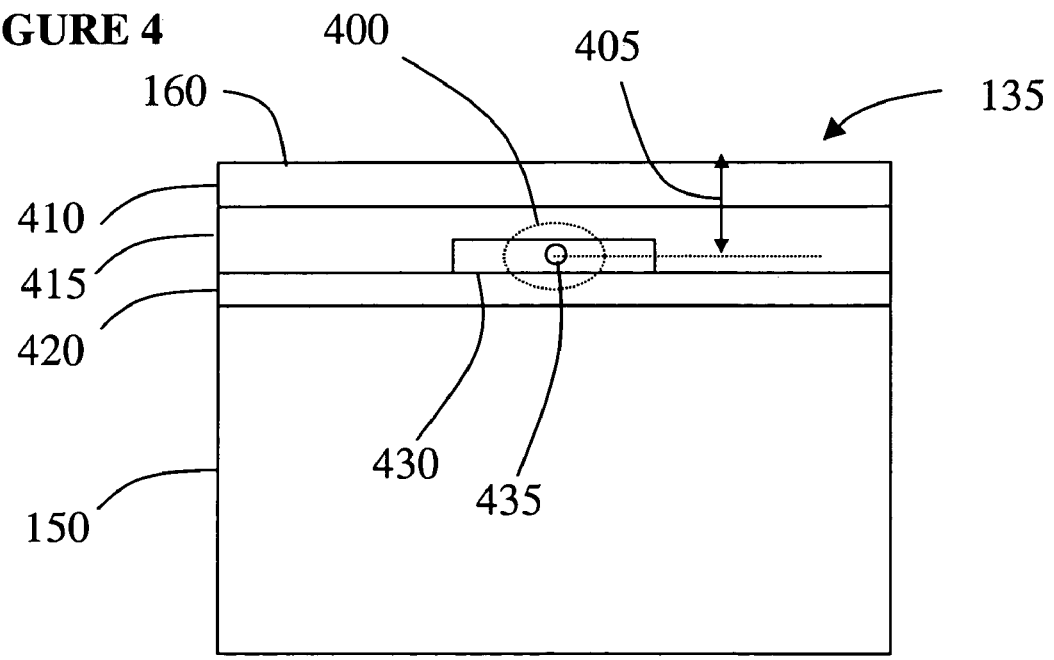
FIG. 4 shows schematically in transverse cross section the structure of a waveguiding device which might be used as a second of the optical components of FIG. 1.

Referring to FIGS. 3 and 4, regardless of the layer structure the aim of optical alignment by flip chip mounting will usually be to align optical confinement regions in the optical components. If the relevant optical confinement regions are aligned then optical radiation propagating in a first device can generally be coupled to propagate in a second device. Further, it will often be the case that each optical confinement region has a propagation axis and the aim of the optical alignment is to align these axes. Alternatively or additionally, the aim of the optical alignment might be to achieve maximum overlap between beam spots for radiation travelling in the devices.

Importantly, it is not necessarily just the dimensions of the upper cladding layers 120, 105 that are important. The central axis 335, 435 of propagation along which radiation travels in use of a device will usually be determined by several factors which control the position and shape of an optical beam travelling along a confinement region. These factors will include for example the thicknesses of all relevant core and cladding layers and their relative refractive indexes. These factors together will control the beam spot size and cross section in use and will determine the distances 305, 405 between the central optical propagation axes 335, 435 and the bonding surfaces 155, 160 of respective devices 130, 135.

FIG. 3 shows a schematic cross section of the layer structure of a laser diode 130 in a direction transverse to the optical axis in use. Referring to FIG. 3, although other types of laser diode 130 might be used, one form of laser diode 130 which might be used has a confinement region comprising a buried active region 330. In more detail, the laser diode 130 has an "n"-doped layer 325 with a raised mesa structure supporting an active region 330. Above the active region 330 there is a "p"-doped layer 315. To either side of the mesa structure there are insulating regions 320. In use, current is passed across the pn junction generated by the proximity of the "p"-doped layer 315 to the "n"-doped layer 325 in the mesa structure. The insulating regions 320 block the passage of current to either side of the mesa structure. The result is that the current is channelled through the active region 330 to produce maximised lasing activity.

Suitable materials for fabricating a laser of this type can be selected from (but are not limited to) semiconductor materials from the III-V groups of the Periodic Table, such as GaInAsP/InP. Other examples of suitable materials can be selected from the group $Al_{1-x}Ga_xAs$, $In_{1-x}Ga_xAs_{1-y}P_y$, $Al_xGa_yIn_{1-x-y}P$ and $In_{1-x}Ga_xAs$.

The layers of a laser diode 130 can have at least two functions. A first function may be an electrical function as described above which encourages lasing to occur and to generate optical radiation in the laser diode 130. A second function is the optical function of providing a confinement cross section 300 in which the optical radiation so generated will propagate. This is done by selecting layers having appropriate refractive indexes. The confinement cross section 300 in the laser diode 130 shown in FIG. 3 has the central propagation axis 335 as shown, in use.

A third function of the layers of a device such as the laser diode 130, in embodiments of the present invention, is to determine the distances 305, 405 between the central optical propagation axes 335, 435 and the bonding surfaces 155, 160 of respective devices 130, 135. In FIG. 3, a "spacing layer" 310 is shown for this purpose. Although it may have additional functions in some embodiments, such as planarisation, an important function of this spacing layer 310 is to adjust the distance 305 between the central optical propagation axis 335 and the bonding surface 155 of the laser diode 130.

FIG. 4 shows a schematic cross section of the layer structure of a waveguiding device 135 in a direction transverse to the optical axis in use. A form of waveguiding device 135 which might be used has a buried ridge 430 of core material. The ridge 430 is buried in an upper cladding layer 415 and sits on a lower cladding layer 420. This structure produces a confinement cross section 400 centred on an axis 435 in the core material 430.

Just as in the laser diode of FIG. 3, a function of the layers of the waveguiding device 135, in embodiments of the present invention, is to determine the distance 405 between the central optical propagation axis 435 and the bonding surface 160 of the waveguiding device 135. In FIG. 4, a spacing layer 410 is shown for this purpose. This spacing layer 410 is added to adjust the distance 405 between the central optical propagation axis 435 and the bonding surface 160 of the waveguiding device 135.

Figure 5:
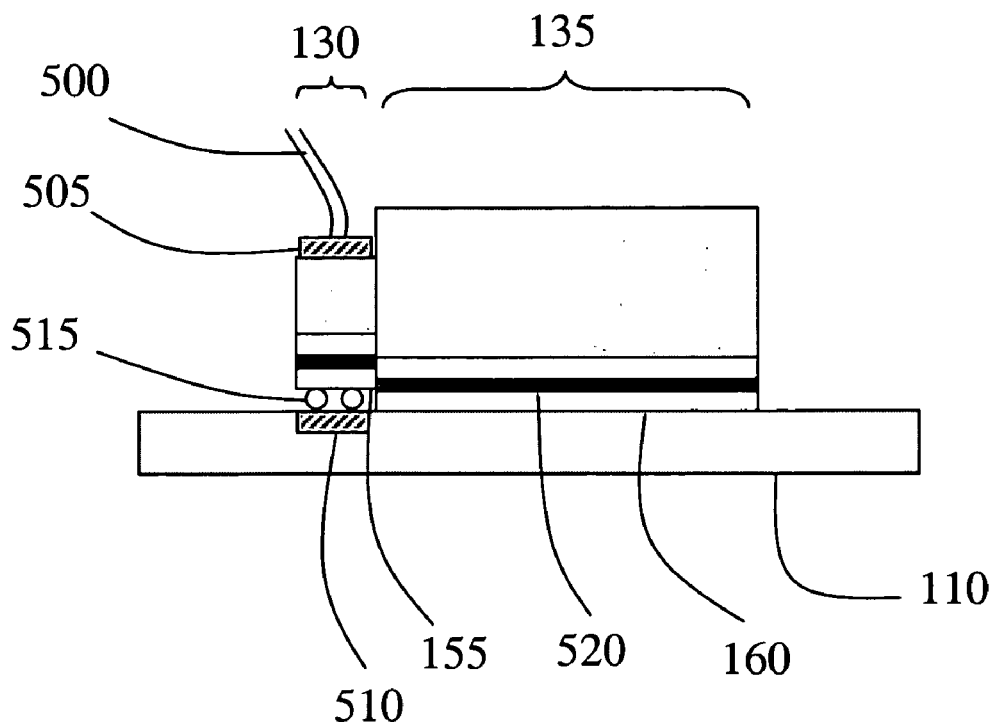
FIGS. 5 and 6 show schematically in longitudinal cross section an arrangement for providing electrical contact to a laser diode as one of the optical components shown in FIG. 1.
Figure 6:
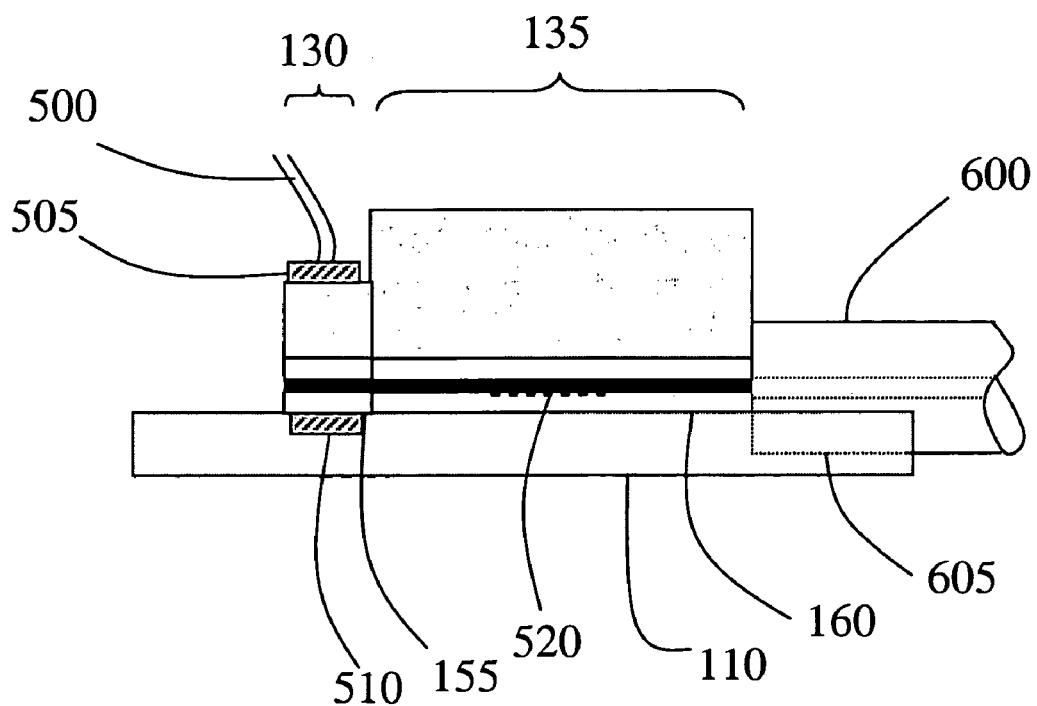
Figure 7:
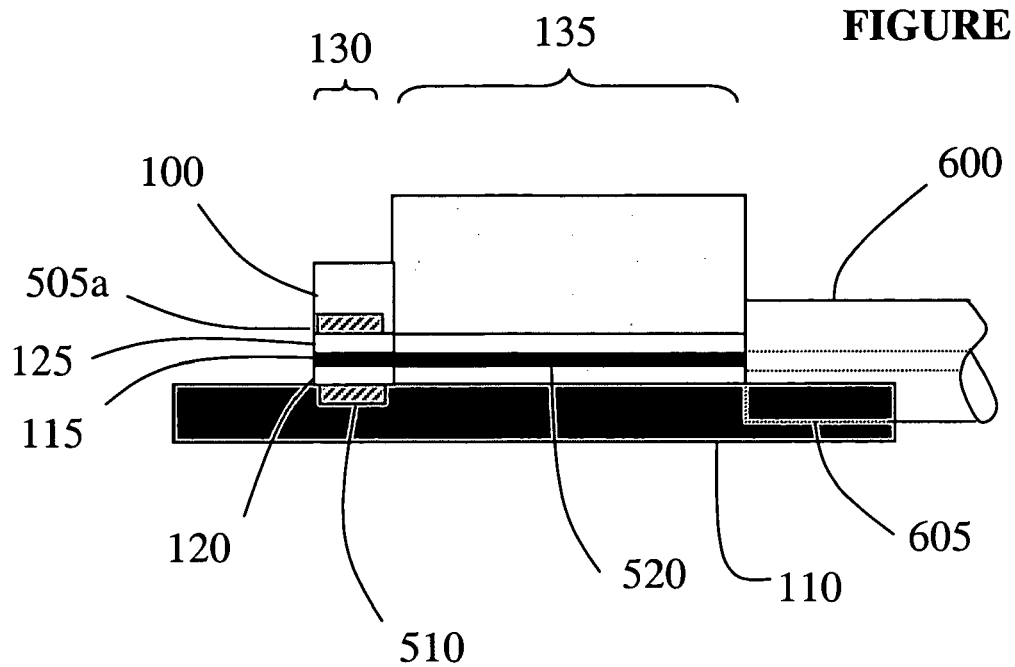
FIG. 7 shows schematically in longitudinal cross section an alternative arrangement for providing electrical contact to a laser diode to the arrangement shown in FIGS. 5 and 6.

Referring to FIGS. 5, 6 and 7, in this embodiment a function of the waveguide device 135 is to provide feedback to the laser diode 130 and it is provided with a DBR grating 520 for this purpose. The DBR grating 520 is disposed along a surface of the ridge 430.

What is important when the structures of FIGS. 3 and 4 are flip chip mounted on a shared substrate will usually be that the optical axes 335, 435 are aligned to give sufficient optical coupling in use and this can be achieved by use of the spacing layers 310, 410.

During bump bonding, lateral optical alignment of the laser diode 130 with the waveguide 135 (in a plane parallel to the bonding surfaces 155, 160) is taken care of using the known technique of alignment markings. Alignment in the direction normal to the bonding surface 155 is passive, being primarily determined by the distance of the confinement regions 300, 400 in the laser diode 130 and the waveguide 135 from their bonding surfaces 155, 160. However, the thickness of the bonding material may also be relevant. It would also be possible to use a different mounting technique for one of the components, or to use different bonding materials or thicknesses of bonding material.

In an example in which a laser diode 130 is already present on the shared substrate 110, then the next step is to obtain the distance of the optical axis of the laser diode 130 from the substrate 110. This can be calculated or measured or might be provided in the device specification and will include the thickness of any bonding material. Based on this information, the required thickness of the "upper" cladding layer 105 of the waveguide 135 can be calculated to give optimal optical coupling efficiency between the laser diode 130 and the waveguide 135 and an appropriate spacing layer 410 can be applied.

It would of course also be possible to flip chip mount and bump bond both the laser diode 130 and the waveguide 135, or to bump bond the laser diode 130 when the waveguide 135 is already in place.

Figure 8:
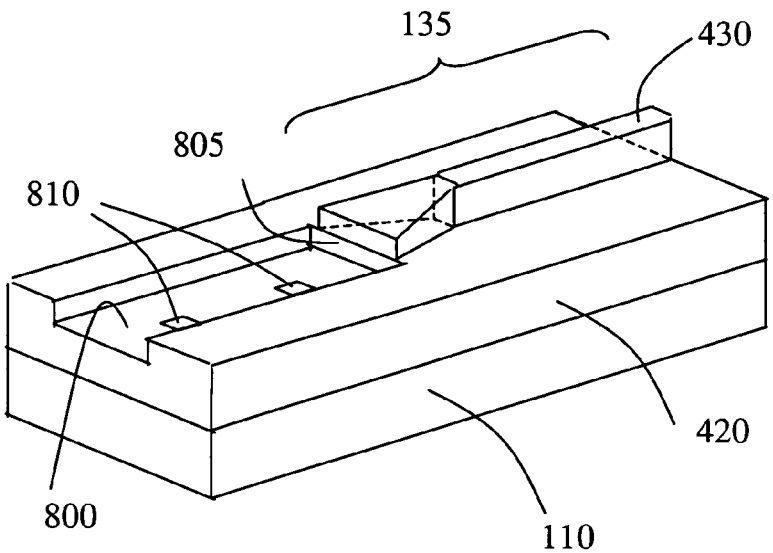
FIG. 8 shows in elevation a view of a substrate carrying an optical waveguide, prior to mounting of a laser diode in optical alignment therewith.
Figure 9:
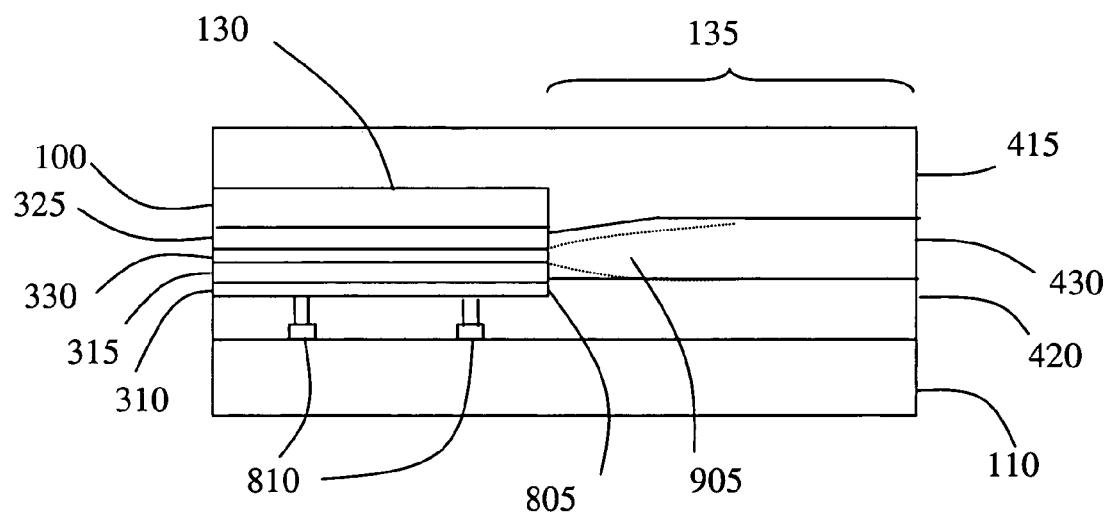
FIG. 9 shows a vertical cross section along the optical axis of the optical waveguide of FIG. 8, after flip chip mounting of the laser diode and the addition of a planarisation layer.

Referring to FIGS. 8 and 9, it might be noted that it is not essential that more than one component is flip chip mounted. One of the components might be mounted, deposited or otherwise fabricated onto a shared substrate 110. The benefit of an embodiment of the present invention can be obtained by using a planar fabrication technique to ensure that a bonding surface of just one component is at a measured distance from its optical confinement region so that, when that component is flip chip mounted, it comes into a position for optical coupling with another component.

FIG. 8 shows a partially complete assembly, comprising a substrate 110 and a waveguide structure 135. A cladding layer 420 of the waveguide structure 135 extends over the whole surface of the substrate 110 and provides a recess 800 with electrical contact pads 810 and an abutment surface 805 aligned with an end facet of the waveguide structure 135.

In FIG. 9, a laser diode 130 has been flip chip mounted into the recess 800, against the abutment surface 805. The abutment surface 805 brings an output facet of the laser diode 130 into the correct position along the optical axis for optical coupling to the waveguide 135, in use. The correct vertical positioning however has been achieved by the use of a spacing layer 310 on the laser diode 130 of calculated depth. In use, an output beam of the laser diode 130 will then be coupled into the waveguiding structure 135 where the beam cross section undergoes an expansion 905 due to a tapered end of the waveguiding structure 135 to bring it to a size suitable for coupling into for example an optical fibre (not shown). (Tapered waveguides of this type are known and not therefore further discussed herein.) Electrical connection is made to the laser diode 130 by means of the contact pads 810.

As shown in FIG. 9, an upper cladding layer 415 of the waveguiding structure 135 can be extended over the whole assembly, providing planarisation.

An assembly such as that shown in FIGS. 8 and 9, and a method for its fabrication apart from the use of the spacing layer 310, is described in copending International patent application number PCT/GB2003/004129, also in the name Optitune plc, the disclosure of which is hereby incorporated by reference.

Figure 10A:
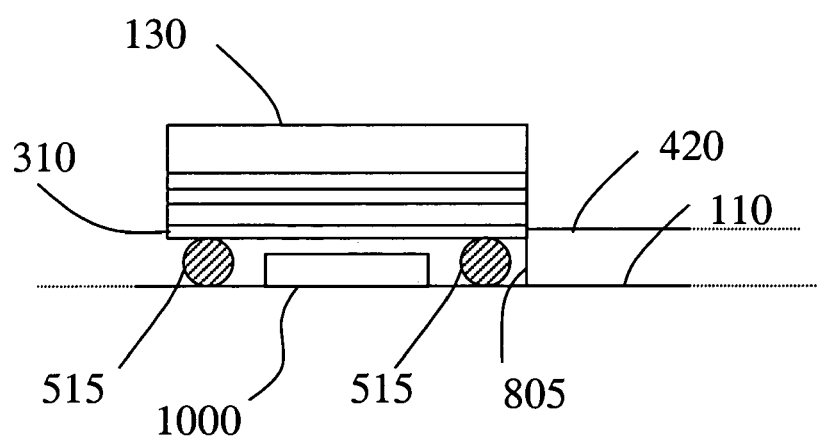
FIGS. 10a and 10b show an alternative mounting arrangement for achieving accurate positioning of an optical component for optical alignment with another component on a substrate.
Figure 10B:
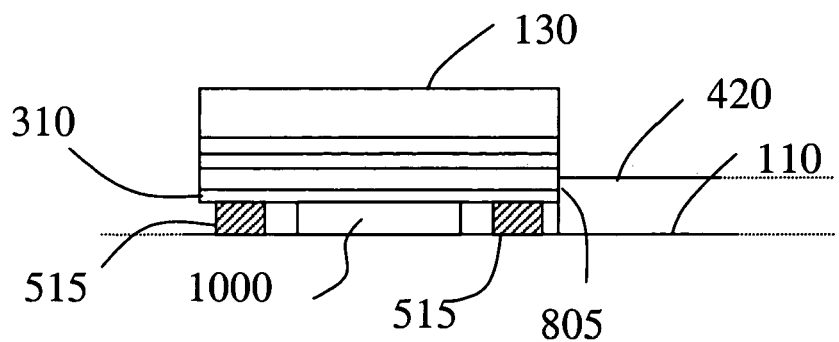

Referring to FIGS. 10a and 10b, the vertical positioning of a flip chip mounted device or component may be affected by a combination of factors and these may need to be taken into account. FIGS. 10a and 10b show a laser diode 130 of the type shown in FIG. 9, in two stages of being flip chip mounted onto a planar substrate 110 using bump bonding. FIG. 10a shows the laser diode 130 prior to bonding, sitting on two bonding bumps 515, and FIG. 10b shows the laser diode after bonding.

The planar surface 110 has been provided with a cladding layer 420 providing an abutment surface 805 to position the laser diode 130 accurately in the direction parallel to its optical axis in use. Between the bonding bumps 515, there is provided another positioning feature, this time a spacer 1000 of predetermined height, for instance 5 μm. This spacer 1000 can in practice be fabricated from the same layer and material as the cladding layer 420 in the same photolithography step by using a grayscale photomask or in a separate step using etching. Referring to FIG. 10b, after bonding has taken place, the vertical position of the laser diode 130 is partly controlled by the depth of the spacer 1000.

In the arrangement of FIGS. 10a and 10b, the spacing layer 310 providing the bonding surface of the laser diode 130 can be used in fine tuning the final positioning of the mounted laser diode 130, rather than as the primary vertical positioning feature. This time, the spacer 1000 provides the primary vertical positioning feature.

In this embodiment, a particularly suitable material for use in providing the spacer 1000 as well as the cladding layer 420 is a hybrid glass material. These materials are discussed elsewhere in this specification, for instance below under the heading "Core and cladding/spacer layers 115, 140, 120, 125, 105, 145". However an aspect which makes them particularly suitable here is that they can be used to contribute optical properties, such as described here where the cladding layer 420 is contributing to optical confinement in the waveguide 135, and they can also be lithographically processed, including gray scale lithography, or etched. Thus the spacer 1000 and the cladding layer 420 can be created in one processing operation to provide a non-planar (and, as shown in FIGS. 10a and 10b, discontinuous) surface for supporting both the laser diode 130 and a waveguide 135.

In practice, in an embodiment as shown in FIGS. 10a and 10b, it might be preferred to leave out the spacing layer 310 in the component 130 and to rely solely on the dimensions of the spacer 1000 and the cladding layer 420 to achieve optical alignment of the diode 130 and waveguide 135.

Electrical Connection

FIGS. 5 to 7 show schematic cross sections of a laser diode 130 and a waveguiding device 135, in a direction parallel to the optical axis in use, at different stages of mounting on a shared substrate 110. Referring to FIGS. 5 to 7, electrical connection can be made to a flip chip mounted device in more than one way. In these figures, the example is used of the laser diode 130 but other components could be selected for electrical connection in any suitable manner.

In FIG. 5, the laser diode 130 is shown prior to bump bonding using a thermo-setting bonding material 515. The waveguide 135 is already in place. Electrical connection is provided to the laser diode 130 via a wire bond 500 to a conductive pad 505 on its exposed surface and a further contact pad 510 is provided in the shared substrate 110. Bonding bumps 515 are provided between the laser diode 130 and the shared substrate 110.

Referring to FIG. 6, heat has been applied such that the bonding bumps have softened and provided a bond between the shared substrate 110 and the "upper" cladding layer of the laser diode 130 (now inverted). This has brought the laser diode 130 back into optical alignment with the waveguide device 135.

FIG. 6 also shows a fibre end 600 supported in a "V" groove 605 in the shared substrate 110 and butt coupled to the waveguide device 135. This type of arrangement is described in European patent application 02256515.4, in the name of the present applicant, the subject matter of which is hereby incorporated.

FIG. 7 shows a slightly different arrangement to that of FIGS. 5 and 6. Instead of a conductive pad 505 on the exposed surface of its substrate 100, a conductive pad 505a has been fabricated onto the opposite face of its substrate 100, prior to creation of the cladding and core layers 125, 115, 120. Electrical connection can be made to this for instance via a side face of the laser diode 130 and/or interconnect material in the substrate 100.

It might be noted that the use of bump bonding may need to be taken into account in calculating the required thickness of a spacing layer 310, 410 to be used since the bonding bumps 515 themselves will usually introduce some thickness which affects vertical positioning of a bump bonded device 130, 135.

In providing electrical connection to a device such as a laser diode 130, the material of a spacer layer 310 may need to be selected to be conductive in order that drive current can be supplied through contact pads 510 in the shared substrate 110. Alternatively, conductive connections could be constructed through the spacer layer 310 to a conductive layer in the device.

Materials

Referring to FIG. 1, known materials can be used in an embodiment of the present invention.

Substrates 100, 150, 110

For example, any one of the substrates 100, 150, 110 might comprise silicon, glass, composite materials, ceramics including multi-layer ceramics such as alumina, and low temperature-co-fired ceramics (LTTC), and even conventional printed circuit board materials such as polyimide and FR-4.

Core and Cladding/Spacer Layers 115, 140, 120, 125, 105, 145

The core and cladding layers 115, 140, 120, 125, 105, 145 might typically comprise glasses, ceramics, polymeric materials and/or hybrid glass materials which have both organic and inorganic components. After deposition, the upper cladding layer 120, 105 might advantageously be further processed to improve the bonding surface it offers, for instance by polishing such as the known technique of chemical mechanical polishing (CMP).

As mentioned above, a particularly useful class of materials for use here is hybrid glass material, being a material of amorphous structure with both organic and inorganic components. This includes hybrid glasses based on alkoxides used as precursors.

(It should be noted that the mechanical and optical properties of the hybrid glass material are affected by the degree of reaction/polymerization of the precursor molecules during synthesis. Metal alkoxide or salt groups and functional organic moieties can remain unreacted during the synthesis. When the materials are processed and cured, the unreacted groups may cause severe stress build up in the films or structures and lead to structural failure. This can be prevented by driving the condensation reactions of metal alkoxides and salt groups, and polymerisation of the organic moieties, further during the synthesis of the material using catalysts and proper reaction conditions. For example, it is possible to use silicon chlorides instead, or chlorides together with alkoxides, although other suitable techniques are known.)

As mentioned above, hybrid glass materials can be selected to have particular characteristics to suit a particular application. For instance, a hybrid glass material can be selected that can be processed using either high or low processing temperatures, and simple processing techniques. Hybrid glass materials are generally relatively stable and have mechanical properties which are more adjustable than either an organic material or an inorganic glass on its own. They can be selected to be easy to polish by having a high elastic modulus (>2 GPa), they can be thermally stable up to 500° C. and they can be used in standard integrated circuit processing and manufacturing lines to produce layers of accurate thickness.

These characteristics arise as follows—

High or Low Temperature Processing:

By selection of appropriate components, it is possible to use high or low temperature processing of a hybrid glass material, for instance at 450° C. or less than or equal to 200° C. or even less than or equal to 150° C. Low processing temperatures are made possible by using thermal- or photo-initiators resulting in polymerization of the organic matrix. The polymerisation may be achieved through organic carbon-carbon double bond openings and crosslinking. Known thermal initiators include benzophenone and various peroxides, such as benzoylperoxide and layroyl peroxide. Known photoinitiators include phenyl-bis(2,4,6-trimethylbenzoyl)phosphine oxide (Irgacure 819) and 1-hydroxy-cyclohexyl-phenyl-ketone (Irgacure 814). (Irgacure initiators are products of Ciba Specialty Chemicals Inc. and "Irgacure" is a registered trade mark.)

Simple Processing Techniques:

For example, a hybrid glass material can be designed to support lithographic processing by including an organic component which polymerises by cross-linking. This might be for example one or more of the functional hydrocarbon compounds comprising acrylates, epoxides, alkyls, alkenes, or aromatic groups which support photopolymerisation. Further, hybrid glass materials can be processed to produce a thick assembly structure (for instance in the range from 1 micron to 1 mm) by lithographic means.

Adjustable Mechanical Properties:

In general, the mechanical properties of a hybrid glass can be adjusted by changing the relative content of inorganic versus organic materials. For example, if the concentration of inorganic materials is increased:
 the coefficient of thermal expansion (CTE) decreases
 the hardness increases
 the stress modulus increases
 stability typically increases.
If the concentration of organic materials is increased:
 the material softens and becomes more elastic
 the CTE increases
 stability typically decreases.

As well as the above general mechanical characteristics, determined by the relative proportions of inorganic/organic materials, the behaviour of a hybrid glass can also be affected by the specific components selected. Furthermore, the use of thermal- and/or photoinitiators can affect thermal stability and an inorganic matrix may capture and protect an organic matrix and thereby give higher stability.

Bonding

The shared substrate 110 might carry any number of components. Usefully, it might be prepared for instance by pre-fabricating a V-groove to align a fibre to a device that will be mounted on it.

The bonding between the shared substrate 110 and the flip chip mounted components 130, 135 can be based on anodic bonding, thin films of thermo setting glues (such as epoxies or hybrid glass), or the use of a monomeric adhesion and joining layer. Alternatively, a thermo setting top layer can be applied to the components 130, 135 prior to flip chip mounting. For example, a thermo setting upper cladding layer 105 can be used in the waveguide device 135.

Examples of monomeric adhesion promoters are:
1 w-% of glysidoxy propyl trimethoxy silane in isopropanol
1-w % of 3-amino propyl triethoxysilane in isopropanol
1 w-% vinyl trichlorosilane in mesitylene
1-w % of allyl trichlorosilane in mesitylene.

There are known thermo-setting materials for use in mounting optical components, in particular epoxy and silicon based materials, and any one might be used, subject to performance testing. Possible candidates are for example those manufactured by Epoxy Technology and supplied as Epotek 353ND (non-conductive), Epotek H73 (non-conductive) or Epotek H20E (conductive). Other potential suppliers are: Loctite, Dow Corning and Emerson & Cuming.

WORKED EXAMPLE

The following describes materials and planar fabrication techniques for fabricating a waveguide device 135 of the type shown in FIGS. 1 and 2 and flip chip mounting it on a substrate 110 in optical alignment with a laser diode 130.

The cladding layers 145, 105 are a composition of 0.1 mol of vinyltrichlorosilane and 0.1 mol of phenyltrichlorosilane. This composition gives a refractive index after final film annealing at 230 deg C. of 1.5060 at 1552 nm wavelength. The synthesis of the cladding layers 145, 105 is based on hydrolysis and polycondensation reactions. The viscous raw material is diluted into a methylisobutylketone (MIBK) solvent so that the viscosity of the material is 150 mPas. A thermal initiator is added to enhance thermal crosslinking of the vinyl groups. The core layer 140 has the same composition as the cladding layers 145, 105 but is doped with 2% germanium chloride so that its refractive index is 1.5100 at 1552 nm wavelength after final annealing at 235 deg C. The viscous core layer material is diluted into MIBK so that the resulting viscosity of the film is around 15 mPas. Thermal and photoinitiators are added to enhance the vinyl crosslinking and make the film photosensitive to UV-light.

Known thermal initiators include benzophenone and various peroxides, such as benzoylperoxide and layroyl peroxide. Known photoinitiators include phenyl bis(2,4,6-trimethylbenzoyl)phosphine oxide (Irgacure 819) and 1-hydroxy-cyclohexyl-phenyl-ketone (Irgacure 814). (Irgacure initiators are products of Ciba Specialty Chemicals Inc. and "Irgacure" is a registered trade mark.)

The following lists the purposes of the precursors mentioned above although it should be noted that they may be multi functional:

Phenyltrichlorosilane

The trichloro part of the molecule undergoes hydrolysis and condensation and forms a silicon oxide matrix. The phenyl moiety is highly stable and also provides physical flexibility and elasticity in the resulting material. This component increases the CTE from silicon dioxide values.

Vinyltrichlorosilane

This is used to create photosensitivity in the material. A vinyl moiety forms the photosensitivity through the carbon to carbon double bond breakage and continual crosslinking polymerisation. The organic polymer matrix formed increases the CTE. The organic matrix is not as stable as an inorganic silicon oxide matrix. The trichloro part undergoes hydrolysis and condensation and forms a silicon oxide matrix.

Germanium Chloride

This is a tetravalent molecule containing four chloride substituents that undergo hydrolysis and condensation to form [Ge—O—Ge] bonds and to form [Si—O—Ge] bonds. This molecule increases the crosslinking density of the material during the condensation polymerization. It increases the refractive index value of the material. The oxide matrix which is formed decreases the CTE of the material.

The material of the lower cladding layer 145 is spun onto a silicon wafer at 1500 rpm and the film is annealed at 230 deg C. for 4 hours in a nitrogen atmosphere. The material of the core layer 140 is spun onto the lower cladding layer 145 again at 1500 rpm. The film is first baked at 150 deg C. for 5 minutes, exposed to UV light (365 nm) through a dark field waveguide mask for 30 seconds and then baked again at 150 deg C. for 10 seconds. The substrate with the film is soaked into a chemical developer to remove unexposed regions of the waveguide core film. The fabricated structures are co-annealed at 235 deg C. (in nitrogen) for 4 hours. The waveguide core is then exposed to a DUV laser (193 nm) through a phase mask to generate changes in refractive index to create a grating 520 in the waveguide core. Finally, a cladding material 105 is deposited on top of the cladding and waveguide core layers 145, 140 at 1000 rpm and the resulting fully planarized stack is co-annealed at 230 deg C. for 4 hours. The cladding material 105 has both an optical function as a confinement layer of the waveguide 135 and the physical function of creating a spacing layer and the resulting thickness (height) of the cladding layer is thus important. In this embodiment, the thickness is 22454 nm and the thickness (height) and width of the waveguide core layer are approximately 6550 nm.

Before integration the waveguide chip with the grating is diced out of the substrate and its optical facets are polished.

A commercial semiconductor laser diode 130 (emitting at 1550 nm range), to be optically aligned with the waveguide 135, is "top coated" with a spacer layer 310 so that the axis of the optical confinement region 300 of the diode is spaced 25729 micrometers away from the top surface. For example a dielectric or conductive material or a combination of both can be added to the laser diode by chemical vapour deposition, ion-beam evaporation, e-beam evaporation or liquid phase deposition. For example, silicon dioxide can be used primarily as the spacer layer 310, followed by a stack of materials to enable contact to be made to the laser. The choice of materials in the stack depends on what the contact layers are going to be deposited on. For instance, good adhesion will be required. Examples of combinations that might be used for contact layers with the silicon dioxide spacer layer 310 are:

1. first (onto to the silicon dioxide spacer layer 310) a titanium layer then a platinum layer and last a gold layer; or
2. first a chromium layer then a nickel layer and last a gold layer.

The gold layer in the second example could be replaced by other materials, such as aluminium. The layer thicknesses are usually in the order of a few hundreds of nanometers.

Another suitable material for providing a dielectric spacer layer 310 for the laser diode 130 is the hybrid glass material described above as a cladding material 105, 145, 410 for the waveguide 135. This can be spun on while the laser diode 130 is still on a wafer prior to dicing, during manufacture.

The diode's two electrical contacts 505, 510 can be manufactured to be in the bottom of the device and connected at one sidewall respectively.

The waveguide component 135 is flip-chip mounted onto bonding material so that the exposed cladding layer 105 abuts the shared substrate 110 and laterally aligned based on standard alignment marks. The chip 135 is pre-bonded to the shared substrate 110 with zero-shrinking epoxy adhesive. The laser diode 130 is flip-chip bonded in similar manner. After that the diode and the waveguide chips 130, 135 are wire-bonded from conductive pads on the chips 130, 135 and on the shared substrate 110. Finally, the chips 130, 135 are partially sealed with non-shrinking epoxy adhesive.

Alternatively the chips 130, 135 can be bonded to the shared substrate 110 using a so called ionic wafer bonding technique or molecular wafer bonding technique, based on for example a coating 10 to 100 nm thick of ethyl trichlorodisilane produced bonding material.

It is sometimes the case that an optical device or component has a non-planar surface. For example, a ridge waveguide 135 such as the one described above with reference to FIG. 4 may offer a non-planar surface. Rough or non-planar surfaces can be complicated to bond and the resulting bond strength can be low due to a small bonding area. Options for dealing with this are for example mechanical or chemical polishing and/or planarisation. Planarisation can be done by spinning an additional thick layer of a material such as a hybrid glass, or an adhesion material, onto the non-uniform surface.

It should be noted that although words such as "vertical", "upper" and "lower" might be used in this specification, these should not be taken to indicate any particular orientation of a device, component or assembly unless the context indicates otherwise. These terms are generally references to the way a device, component or assembly happens to be shown in the Figures and are used for convenience of the description only.

What is claimed is:

1. An optical assembly comprising:
    i) at least first and second optical components, each having an optical confinement region and an optical axis in use, and at least the first optical component having a substrate and one or more layers defining the optical confinement region; and
    ii) a shared substrate,
    wherein said first optical component comprises an optoelectronic device which is provided with a bonding surface and is flip chip mounted on the shared substrate by means of said bonding surface and the optoelectronic device and the second component are supported by the shared substrate such that their respective optical confinement regions are optically coupled in use, and
    wherein at least the optoelectronic device is provided with a spacing layer between the optical axis of the optoelectronic device and the bonding surface, additional to the optoelectronic device, which spacing layer provides the bonding surface for said flip chip mounting of the optoelectronic device, enables electrical contact to be made to the optoelectronic device, and determines the distance from the bonding surface to the optical axis of the optoelectronic device when mounted on the shared substrate, to achieve said optical coupling in use, said spacing layer comprising a glass material having both organic and inorganic components.

2. An assembly according to claim 1 wherein the shared substrate provides a planar surface on which both said first and second components are flip chip mounted to achieve said optical coupling in use.

3. An optical assembly according to claim 1 wherein the distance from the bonding surface to the optical axis for the first component is matched to the distance from the bonding surface to the optical axis for the second component to an accuracy of 300 nm or less.

4. An optical assembly according to claim 1 wherein the distance from the bonding surface to the optical axis for the first component is matched to the distance from the bonding surface to the optical axis for the second component to an accuracy of 100 nm or less.

5. An optical assembly according to claim 1 wherein the glass material comprises an inorganic matrix provided at least in part by a metal alkoxide or salt that has been hydrolysed.

6. An optical assembly according to claim 5 wherein the metal alkoxide or salt comprises one based on groups 3A, 3B, 4B and 5B of the Periodic Table.

7. An optical assembly according to claim 5 wherein the glass material comprises an organic component to modify the inorganic matrix.

8. An optical assembly according to claim 7 wherein the glass material is adapted to be processed at temperatures of more than or equal to 400° C.

9. An optical assembly according to claim 7 wherein said glass material comprises a thermal- or photoinitiator to initiate polymerisation in the glass material for use in lithographic processing.

10. An optical assembly according to claim 7 wherein the glass material is adapted to be processed at temperatures of not more than 200° C.

11. An optical assembly according to claim 7 wherein the glass material is adapted to be processed at temperatures of not more than 150° C.

12. An optical assembly according to claim 1 wherein the optoelectronic device comprises a laser diode.

13. An optical assembly according to claim 12 wherein the laser diode comprises semiconductor material selected from one or more of the III-V groups of the Periodic Table.

14. An optical assembly according to claim 1, the first and second optical components each being flip chip mounted so that its optical confinement region lies between its respective substrate and the shared substrate.

15. An optical assembly according to claim 14 wherein the substrate comprised by the first component has different characteristics from the substrate comprised by the second component.

16. An optical assembly according to claim 15 wherein the substrate comprised by the first component has a different depth from the substrate comprised by the second component.

17. An optical assembly according to claim 1 wherein at least one of the first and second components is provided with an electrical connection by means of its bonding surface.

18. An optical assembly comprising:
    i) at least first and second optical components, each having an optical confinement region and an optical axis in use, and at least the first optical component having a substrate and one or more layers defining the optical confinement region; and
    ii) a shared substrate,
    wherein said first optical component has a bonding surface and is flip chip mounted on the shared substrate by means of its bonding surface and the first and second components are supported by the shared substrate such that their respective optical confinement regions are optically coupled in use,
    and at least the first component further comprises a spacing layer which determines the distance from the bonding surface to the optical axis for the first component to achieve said optical coupling in use, said spacing layer comprising a glass material having both organic and inorganic components, and
    wherein said first and second optical components have bonding surfaces, the distance from the bonding surface to the optical axis for the first component being different from the distance from the bonding surface to the optical axis for the second component, the shared substrate providing a non-planar surface on which both said first and second components are flip chip mounted to achieve said optical coupling in use.

19. An optical assembly according to claim 18 wherein said non-planar surface is provided by a glass material having both organic and inorganic components.

20. An optical assembly comprising:
    i) at least first and second optical components, each having an optical confinement region and an optical axis in use, and at least the first optical component having a substrate and one or more layers defining the optical confinement region; and
    ii) a shared substrate,
    wherein said first optical component comprises an optoelectronic device which is provided with a bonding surface and is flip chip mounted on the shared substrate by means of said bonding surface and the first and second components are supported by the shared substrate such that their respective optical confinement regions are optically coupled in use,
    wherein at least the optoelectronic device has added thereto a spacing layer, additional to the optoelectronic device, which enables electrical contact to be made to the optoelectronic device, and determines the distance from the bonding surface to the optical axis for the first component, when mounted on the shared substrate, to achieve said optical coupling in use, said spacing layer comprising a glass material having both organic and inorganic components, and wherein an optical cladding layer of the second optical component and a support surface for the optoelectronic component are each provided by areas of the same layer fabricated on the shared substrate.

21. An optical assembly according to claim 20 wherein the material of the fabricated layer comprises a hybrid glass material.

22. An optical assembly according to claim 20 wherein the fabricated layer is discontinuous.

* * * * *